United States Patent
Lai et al.

(10) Patent No.: US 8,362,615 B2
(45) Date of Patent: Jan. 29, 2013

(54) MEMORY AND MANUFACTURING METHOD THEREOF

(75) Inventors: Erh-Kun Lai, Taichung (TW); Hang-Ting Lue, Hsinchu (TW); Kuang-Yeu Hsieh, Hsin Chu (TW)

(73) Assignee: Macronix International Co., Ltd., Hsinchi (TW)

(*) Notice: Subject to any disclaimer, the term of this patent is extended or adjusted under 35 U.S.C. 154(b) by 534 days.

(21) Appl. No.: 11/892,980

(22) Filed: Aug. 29, 2007

(65) Prior Publication Data

US 2009/0057748 A1    Mar. 5, 2009

(51) Int. Cl.
*H01L 29/792* (2006.01)

(52) U.S. Cl. .................. 257/754; 257/324; 257/E29.309

(58) Field of Classification Search .................. 257/324, 257/754
See application file for complete search history.

(56) References Cited

U.S. PATENT DOCUMENTS

| | | | |
|---|---|---|---|
| 5,091,762 A * | 2/1992 | Watanabe | 257/71 |
| 6,067,248 A | 5/2000 | Yoo | |
| 6,903,404 B2 | 6/2005 | Kim | |
| 7,566,974 B2 * | 7/2009 | Konevecki et al. | 257/754 |
| 2005/0173766 A1 * | 8/2005 | Chae et al. | 257/369 |
| 2005/0280156 A1 * | 12/2005 | Lee | 257/758 |
| 2006/0071074 A1 * | 4/2006 | Konevecki et al. | 235/454 |
| 2006/0172493 A1 * | 8/2006 | Prall | 438/257 |
| 2006/0198190 A1 * | 9/2006 | Lue | 365/185.12 |
| 2008/0175056 A1 * | 7/2008 | Lee | 365/185.11 |

FOREIGN PATENT DOCUMENTS

| | | |
|---|---|---|
| CN | 1638130 A | 7/2005 |
| CN | 1828944 A | 9/2006 |

* cited by examiner

*Primary Examiner* — David Vu
*Assistant Examiner* — Earl Taylor
(74) *Attorney, Agent, or Firm* — Bacon & Thomas PLLC

(57) ABSTRACT

A memory and a manufacturing method thereof are provided. The memory includes a dielectric layer, a polysilicon layer, a first buried diffusion, a second buried diffusion, a charge storage structure and a gate. The polysilicon layer is disposed on the dielectric layer and electrically connected to at least a voltage. The first buried diffusion and the second buried diffusion are separately disposed in the surface of the polysilicon layer. The charge storage structure is disposed on the polysilicon layer and positioned between the first buried diffusion and the second buried diffusion. The gate is disposed on the charge storage structure.

21 Claims, 4 Drawing Sheets

MEMORY AND MANUFACTURING METHOD THEREOF

BACKGROUND OF THE INVENTION

The invention relates in general to a memory and a manufacturing method thereof, and more particularly to a memory having the structure which can realize multi-layered stacking memory, and a manufacturing method thereof.

DESCRIPTION OF THE RELATED ART

As portable electronic products become more and more popular, the demand for flash memories grows rapidly in the market. When applied to memories on a main board or small-size memory cards, nonvolatile storage provided by flash memories breaks the limit of conventional optical and magnetic storage. The flash memory is stable and has low energy consumption. Also, there is no need to move components in the device. Therefore, the flash memory is an ideal solution for the nonvolatile storage of programs and data in the portable electronic products.

The flash memories in the present market are substantially divided into two types, NOR type and NAND type. The NOR type flash memories are based on Not-OR logical structure, and the NAND type flash memories are based on Not-AND logical structure. Compared to the NAND type structure, the NOR type structure speeds up the data reading and reduces the time for bit rewriting through the parallel configuration. However, the NAND type structure has smaller memory cells and individual blocks than the NOR type structure. Also, the NAND structure has low energy consumption when programming and is faster in programming and erasing. Besides, the memory cell array of the NAND structure has higher density, so that the memory capacity per square millimeter is increased.

However, the memory cell is formed directly on a silicon substrate in the flash memory. As a result, the memory density and capacity of the memory is limited thereto. Therefore, the above-described flash memory is not sufficient to supply the portable electronic product with fast operation and large memory capacity.

SUMMARY OF THE INVENTION

The invention is directed to a memory and a manufacturing method thereof. A polysilicon layer is disposed on a dielectric layer as a substrate and electrically connected to at least a voltage. As a result, a memory cell is formed on the polysilicon layer. Therefore, a programming process of the memory cell on the polysilicon layer is performed through channel hot electron (CHE) injection or channel hot electron induced secondary electron (CHISEL) injection. Also, an erasing process of the memory cell is performed through hole tunneling erase, negative Fowler-Nordheim tunneling (FN tunneling) or band to band hot hole (BBHH) injection. Therefore, several layers of memory cells are able to be formed according to the design of several dielectric layers and several polysilicon layers electrically connected to at least a voltage so as to form a multi-layer stacking memory structure. The memory of the present invention increases the memory density and capacity. The practicability of the memory is improved significantly.

According to a first aspect of the present invention, a memory including a dielectric layer, a polysilicon layer, a first buried diffusion, a second buried diffusion, and a charge storage structure. The polysilicon layer is disposed on the dielectric layer and electrically connected to at least a voltage. The first diffusion and the second diffusion are separately disposed on a surface of the polysilicon layer. The charge storage structure is disposed on the polysilicon layer and is positioned between the first buried diffusion and the second buried diffusion. The gate is disposed on the charge storage structure.

According to a second aspect of the present invention, a manufacturing method of a memory is provided. First, a dielectric layer is provided. Next, a polysilicon layer is formed on the dielectric layer. Then, a charge storage material layer is formed on the polysilicon layer. Afterwards, a gate material layer and a patterned insulation layer are formed on the charge storage material layer orderly. Subsequently, part of the gate material layer and part of the charge storage material layer are removed to form a gate and a charge storage structure. Next, the polysilicon layer is defined to form a first buried diffusion and a second buried diffusion. Afterwards, a first insulation material layer is formed on part of the patterned insulation layer, the first buried diffusion and the second buried diffusion. Then, the patterned insulation layer is removed to form a second insulation material layer on the first buried diffusion and the second buried diffusion. Thereon, a word line is formed on the second insulation material layer and the gate for electrically connecting to the gate. Afterwards, a well is formed on the surface of the polysilicon layer. Next, a plug is formed for electrically connecting to the well, so that the polysilicon layer is electrically connected to at least a voltage.

The invention will become apparent from the following detailed description of the preferred but non-limiting embodiments. The following description is made with reference to the accompanying drawings.

DETAILED DESCRIPTION OF THE INVENTION

Figure 1:
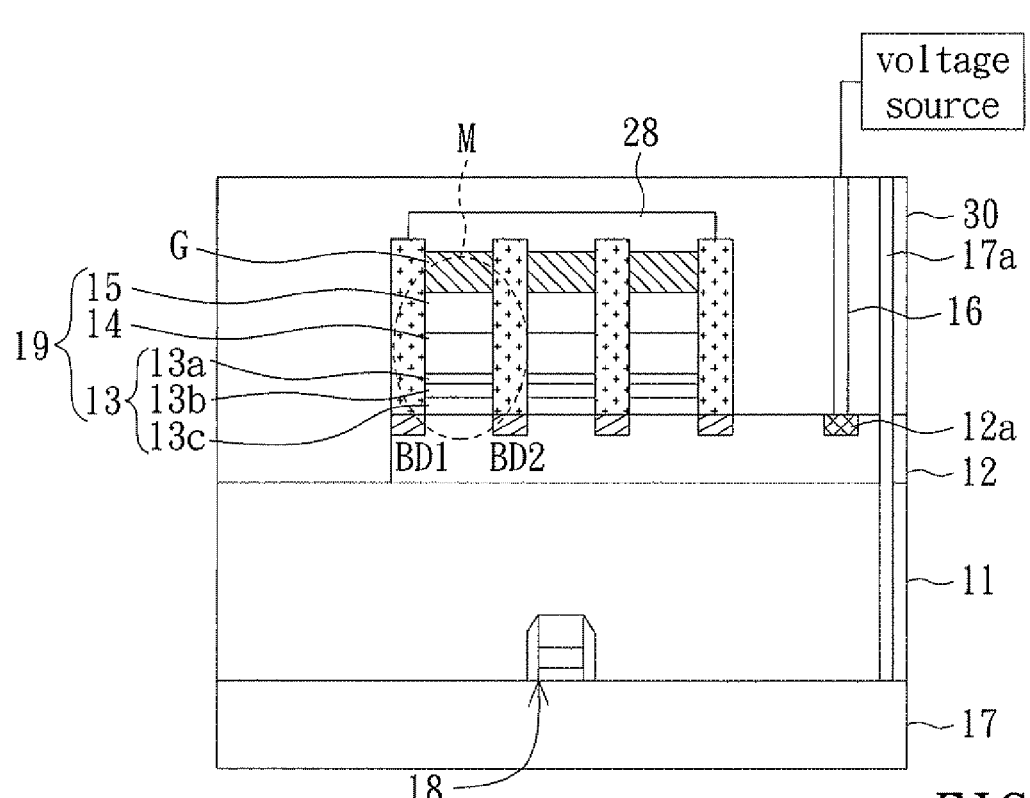
FIG. 1 is a cross-sectional view of a memory according to a preferred embodiment of the present invention.

FIG. 1 is a cross-sectional view of a memory according to a preferred embodiment of the present invention. Please referring to FIG. 1, the memory 10 includes at least a dielectric layer 11, a polysilicon layer 12, a first buried diffusion BD1, a second buried diffusion BD2, a tunneling dielectric layer 13, a charge storage structure 19, a gate G and a word line 28. The polysilicon layer 12 is disposed on the dielectric layer 11 and electrically connected to at least a voltage. The first buried diffusion BD1 and the second buried diffusion BD2 are separately disposed on a surface of the polysilicon layer 12. The charge storage structure 19 is disposed on the polysilicon layer 12 and positioned between the first buried diffusion BD1 and the second buried diffusion BD2. The gate G is disposed on the charge storage structure 19, and the word line 28 is disposed on the gate G and is coupled thereto. The first buried diffusion BD1, the second buried diffusion BD2, the charge storage structure 19 and the gate G form a memory cell M, which is covered by a dielectric layer 30.

In the present embodiment, the memory 10 further includes a conductive plug 16 and a conductive plug 17a respectively electrically connected to the polysilicon layer 12 and a silicon substrate 17, so that the polysilicon layer 12 and the silicon substrate 17 are respectively electrically connected to at least one voltage. Moreover, the memory 10 further includes a well 12a disposed on the surface of the polysilicon layer 12, so that the polysilicon layer 12 is electrically connected to the conductive plug 16. Furthermore, the dielectric layer 11 and the dielectric layer 30 include an interlayer dielectric (ILD) layer or an intermetallic dielectric (IMD) layer. Moreover, the charge storage structure includes a tunneling dielectric layer 13, a charge storage layer 14 and a blocking layer 15 in the present embodiment. The tunneling dielectric layer 13 is disposed on the polysilicon layer 12. The charge storage layer 14 is disposed on the tunneling dielectric layer 13. The blocking layer 15 is disposed on the charge storage layer 14.

The charge storage layer 14 includes a first nitride layer with high trapping rate or can be replaced by an aluminum oxide layer or other high-K material having high dielectric constant. The blocking layer 15 includes a first oxide layer or an aluminum oxide layer. What needs to notice is that the tunneling dielectric layer 13 can include only an oxide layer, such that the charge storage layer 14 and the blocking layer 15 form a memory with SONOS structure. The memory having SONOS structure can be programmed via Hot Carrier Electron (HCE) injection method, and can be erased via negative Fowler-Nordheim(−FN) tunneling method or a Band to Band Hot Hole(BBHH) injection method. Otherwise, the memory having SONOS structure can be programmed via BBHH method, and can be erased via positive Fowler-Nordheim(+FN) tunneling method. Or, the tunneling dielectric layer 13 can include a first dielectric layer, a second dielectric layer and a third dielectric layer, which are respectively exemplified by a third oxide layer 13c, a second nitride layer 13b, and a second oxide layer 13a in the present embodiment. The thickness of the first dielectric layer can be less than 20 angstroms(A), range between 5 A-20 A, or be less than 15 A. The thickness of the second dielectric layer can be less than 20 A or range between 10 A-20 A. The thickness of the third dielectric layer can be less than 20 A or range between 15 A-20 A. The third oxide layer 13c is disposed on the polysilicon layer 12, the second nitride layer 13b is disposed on the third oxide layer 13c, and the second oxide layer 13a is disposed on the second nitride layer 13b. The second oxide layer 13a, the second nitride layer 13b and the third oxide layer 13c provide a modulated tunneling barrier. Therefore, the tunneling dielectric layer 13, the charge storage layer 14 and the blocking layer 15 form an ONONO stack structure so as to form a memory having BE-SONOS structure. The memory having BE-SONOS structure can be programmed via HCE injection method, and can be erased via BBHH or −FN tunneling method. Otherwise, the memory having BE-SONOS structure can be programmed via BBHH method, and can be erased via +FN tunneling method. Or, the second nitride layer 13b can be replaced by a silicon layer, such that the gate G, the blocking layer 15, the charge storage layer 14, the OSO layer as the tunneling dielectric layer and the polysilicon layer form a memory having SONOSOS structure. The memory having SONOSOS structure can be programmed via HCE method, and can be erased via BBHH or −FN tunneling method. Otherwise, the memory having SONOSOS structure can be programmed via BBHH method, and can be erased via +FN tunneling method.

Besides, the technology of the invention is not limited herein. The blocking layer can be disposed on the polysilicon layer, and the charge storage layer is disposed on the blocking layer. Such that electrons or holes are injected from the gate into the charge storage layer. When the material of the gate is polysilicon and the material of the charge storage layer is nitride, and the tunneling dielectric layer does not exist between the gate and the charge storage layer, the memory having (silicon-nitride-oxide-silicon(SNOS) structure is formed. The memory having SNOS structure can be programmed via HCE method to inject carriers from the gate, and can be erased via +FN tunneling method. Otherwise, the memory having SNOS structure can be programmed via BBHH method, and can be erased via −FN tunneling method. When the material of the gate is made of tantalum nitride (TaN), the material of the charge storage layer is nitride, and an aluminum oxide intervenes between the gate the charge storage layer as the tunneling dielectric layer, the memory having TANOS structure is formed. The memory having TANOS structure can be programmed via HCE method, and can be erased via BBHH or −FN tunneling method. Otherwise, the memory having TANOS structure can be programmed via BBHH method, and can be erased via +FN tunneling method. When the material of the gate is polysilicon, the material of the charge storage layer is nitride, and an ONO layer intervenes between the gate and the charge storage layer as a tunneling dielectric layer, a memory having Top BE-SONOS structure is formed. The memory having Top BE-SONOS structure can be programmed via HCE method, and can be erased via +FN tunneling method. Otherwise, the memory having Top BE-SONOS structure can be programmed via BBHH method, and can be erased via −FN tunneling method. When the material of the gate is polysilicon, the material of the charge storage layer is nitride, and an OSO layer intervenes between the gate and the charge storage layer as a tunneling dielectric layer, a memory having SOS-ONOS structure is formed. The memory having SOSONOS structure can be programmed via HCE method, and can be erased via +FN tunneling method. Otherwise, the memory having Top SOSONOS structure can be programmed via BBHH method, and can be erased via −FN tunneling method. When the material of the gate is polysilicon, the material of the charge storage layer is nitride, and a thin oxide layer intervenes between the gate and the charge storage layer as a tunneling dielectric layer, a memory, of which electron and hole are injected from the gate, having SONOS structure is formed. The memory having the top injecting SONOS structure having the same programming and erasing method as the memory, of which electron and hole are injected from channel, having SONOS structure does. The material of the blocking layers of all abovementioned embodiments can be aluminum oxide or silicon oxide, and the material of the charge storage layers thereof can be silicon nitride or aluminum oxide. Likewise, the tunneling dielectric layer between the gate and the charge storage layer can include a first dielectric, a second dielectric layer and a third dielectric layer. The third dielectric layer is disposed on the charge storage layer, the second dielectric layer is disposed on the third dielectric layer, and the first dielectric layer is disposed on the second dielectric layer. The stacking structure of the first dielectric layer, the second dielectric layer and the third dielectric layer can adopt an ONO layer or an OSO layer. The thickness of the first dielectric layer can be less than 20 angstroms(A), range between 5 A-20 A, or be less than 15 A. The thickness of the second dielectric layer can be less than 20 A or range between 10 A-20 A. The thickness of the third dielectric layer can be less than 20 A or range between 15 A-20 A.

The above-described polysilicon layer 14 and the well 12a are first doping type. The first buried diffusion BD1 and the second buried diffusion BD2 are the second doping type. For example, the polysilicon layer is p type, the first buried diffusion BD1 and the second buried diffusion BD2 are N+ type, and the well 12a is P-well. Or, the polysilicon layer is n type, the first buried diffusion BD1 and the second buried diffusion BD2 are P+ type, and the well 12a is N-well. Moreover, the memory 10 further includes a control device 18 and a silicon substrate 17. The control device 18 is disposed between the silicon substrate 17 and the dielectric layer 11. The silicon substrate 17 is an epi-substrate. The control device 18 includes a complementary metal oxide semiconductor (CMOS) device or an X/Y decoder. Therefore, the memory cell M of the present embodiment is formed above the silicon substrate 17 but not directly on the silicon substrate 17.

The polysilicon layer 12 of the present embodiment is electrically connected to at least one voltage via a conductive plug 16. Thus the charge carriers can be drained out via the conductive plug 16. Therefore, the polysilicon layer 12 can maintain stable electric potential and enough potential difference between the polysilicon layer 12 and the gate G is provided to program or erase the memory. As a result, a programming process is preferably performed through methods with localized trapping properties, such as HCE injection or Channel Hot Electron Induced Secondary ELectron (CHISEL) injection, in the memory cell M of the present embodiment. Such that the memory cell storing dual bit can be realized. Furthermore, an erasing process is preferably performed through hole tunneling erase, −FN tunneling, or BBHH injection in the memory cell M of the present embodiment when a −15V voltage ($V_g$) is applied to the gate G. Besides, when the memory cell M in the memory 10 of the present embodiment stores dual bit, the memory cell M is preferably read through reverse read. Therefore, the memory M is known to have two bits per cell. Furthermore, the design of the virtual ground array is preferably applied to the memory 10 of the present embodiment, and a nonvolatile nitride memory is formed. Moreover, the memory 10 of the present embodiment is preferably a NOR type flash memory, and the memory cell M is preferably a SONOS type memory cell.

Figure 2A:
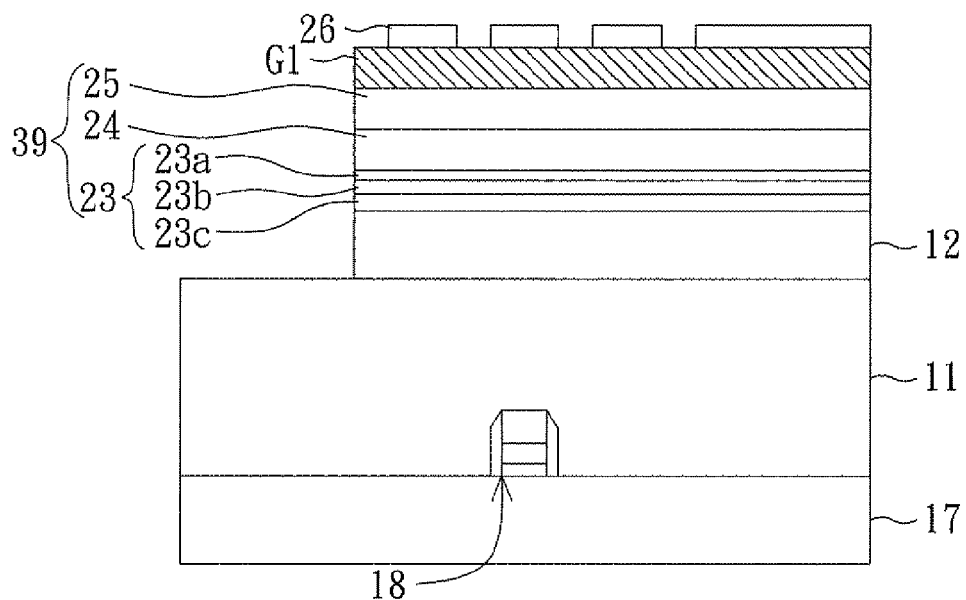
FIGS. 2A-2E are cross-sectional views of a manufacturing process of the memory according to the preferred embodiment of the present invention.

A manufacturing method of the memory according to the present embodiment is illustrated as follow. However, the invention is not limited thereto. Please referring to FIGS. 2A-2E, cross-sectional views of the manufacturing process of the memory according to the preferred embodiment of the present invention are illustrated in FIGS. 2A-2E. First, as shown in FIG. 2A, a dielectric layer 11 is provided. Next, a polysilicon layer 12 is formed on the dielectric layer 11. The thickness of the polysilicon layer 12 is substantially between 600 A and 3000 A. Then, a dielectric material layer 23, a charge storage material layer 39 is formed on the polysilicon layer 12. In the present embodiment, a dielectric material layer 23, a storage material layer 24 and a block material layer 25 are formed orderly. Afterwards, a gate material layer G1 and a patterned insulation layer 26 are formed on the charge storage material layer 39, that is, on the block material layer 25. The dielectric layer 11 includes an interlayer dielectric (ILD) layer or an inter-metallic dielectric (IMD) layer. Furthermore, the blocking material layer 25 and the storage material layer 24 are a first oxide material layer and a first nitride material layer respectively. Moreover, the dielectric material layer 23 is preferably a second oxide material layer. Or, the dielectric material layer 23 preferably includes a second oxide material layer 23a, a second nitride material layer 23b and a third oxide material layer 23c. The second nitride material layer 23b is formed between the second oxide material layer 23a and the third oxide material layer 23c so as to form a BE-SONOS structure. Furthermore, the gate material layer G1 is preferably another polysilicon layer. In the present embodiment, the step of providing the dielectric layer 11 further includes the following sub-steps. First, a silicon substrate 17 is provided. Next, a control device 18 is formed on the silicon substrate 17. Then, the dielectric layer 11 is formed on the silicon substrate 17 to cover the control device 18. The silicon substrate 17 is an epi-substrate. The control device 18 includes a complementary metal oxide semiconductor device or an X/Y decoder.

Figure 2B:
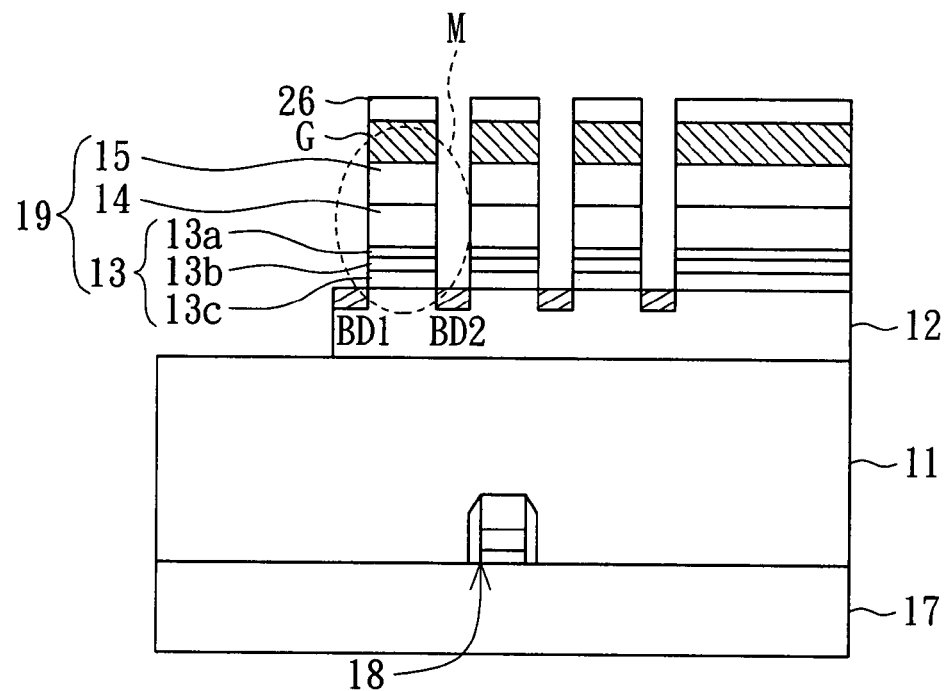

Subsequently, as shown in FIG. 2B, part of the gate material layer G1, part of the blocking material layer 25, part of the storage material layer 24 and part of the dielectric material layer 23 are removed to form a gate G, a blocking layer 15, a charge storage layer 14 and a tunneling dielectric layer 13 so as to form a charge storage structure 19. The polysilicon layer 12 is defined to form a first buried diffusion BD1 and a second buried diffusion BD2 thereon. In other words, two bit lines are formed. The above-described tunneling dielectric layer 13 can include only an oxide layer, or include a second oxide layer 13a, a second nitride layer 13b and a third oxide layer 13c. The second nitride layer 13b is formed between the second oxide layer 13a and the third oxide layer 13c. Besides, the first buried diffusion BD1, the second buried diffusion BD2, the tunneling dielectric layer 13, the charge storage layer 14, the blocking layer 15 and the gate G form a memory cell M. Furthermore, the step of defining buried diffusion on the polysilicon layer 12 is performed through ion implantation.

Figure 2C:
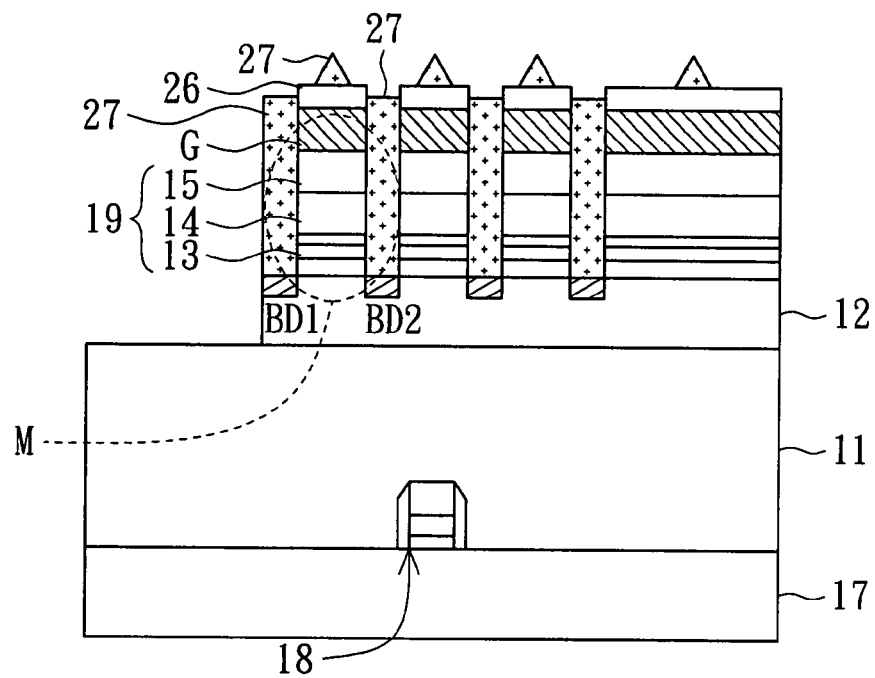

After, as shown in FIG. 2C, a first insulation material layer 27 is formed on part of the patterned insulation layer 26, the first buried diffusion BD1 and the second buried diffusion BD2. The entire insulation layer is formed through high density plasma (HDP) deposition. Then, the above insulation layer is trimmed though etching back process. For example, the insulation layer is trimmed by using hydrofluoric acid (HF). As a result, the first insulation material layer 27 is formed. Moreover, the first insulation material layer 27 has a triangular cross-section on part of the patterned insulation layer 26.

Figure 2D:
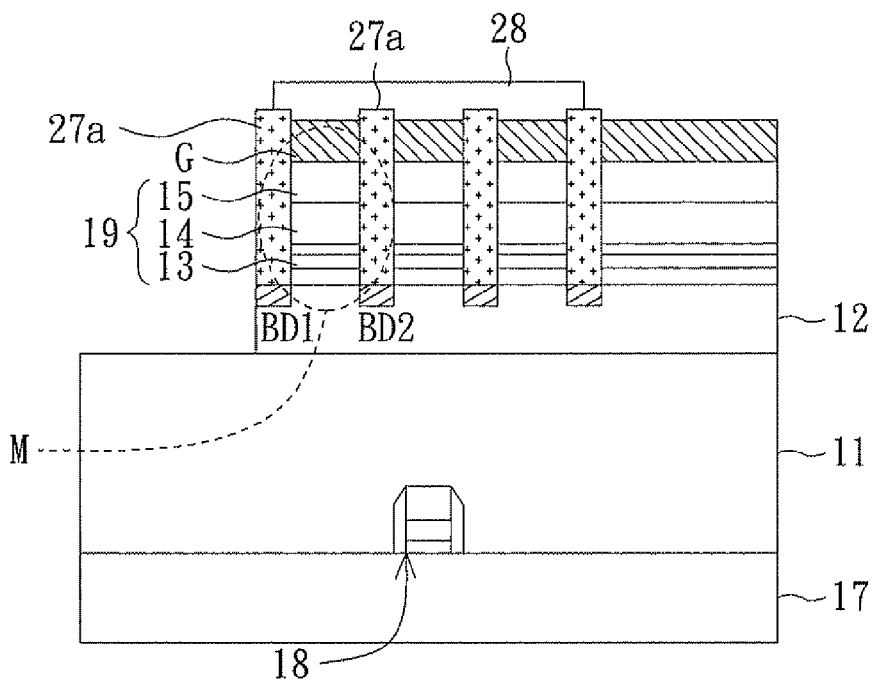

Later, as shown in FIG. 2D, the patterned insulation layer 26 is removed to form a second insulation material layer 27a on the first buried diffusion BD1 and the second buried diffusion BD2. Then, a word line 28 is formed on the second insulation material layer 27a and the gate G for being coupled to the gate G. The patterned insulation layer 26 includes a silicon nitride layer. Furthermore, the step of removing the patterned insulation layer 26 is performed by soaking in Phosphoric Acid ($H_3PO_4$).

Figure 2E:
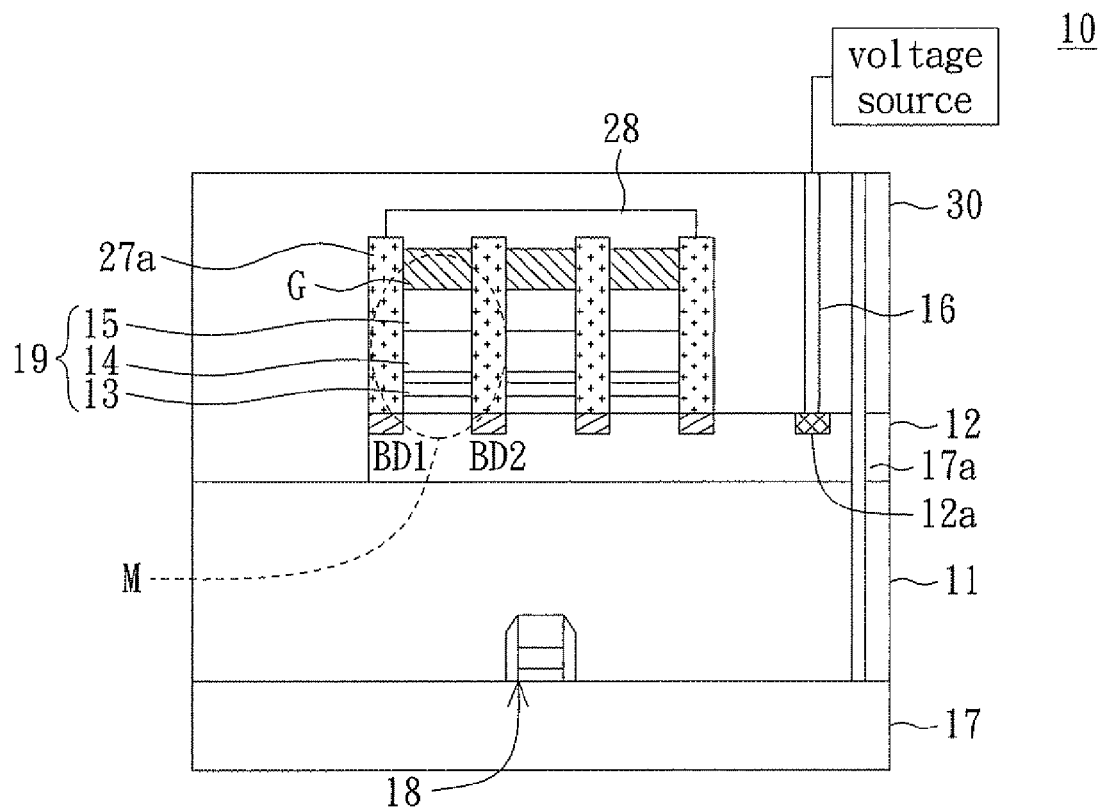

Then, as shown in FIG. 2E, a well 12a is formed on the surface of the polysilicon layer 12. Afterwards, a dielectric layer 30 is formed to cover the memory cell M, and a conductive plug 16 is formed for electrically connecting to the well 12a. As a result, the polysilicon layer 12 is electrically connected to at least one voltage. Likewise, the dielectric layer 30 can be an ILD layer or an IMD layer. Moreover, a conductive plug 17a is preferably formed for electrically connecting to the silicon substrate 17. Then, the memory 10 is completely formed.

Figure 3:
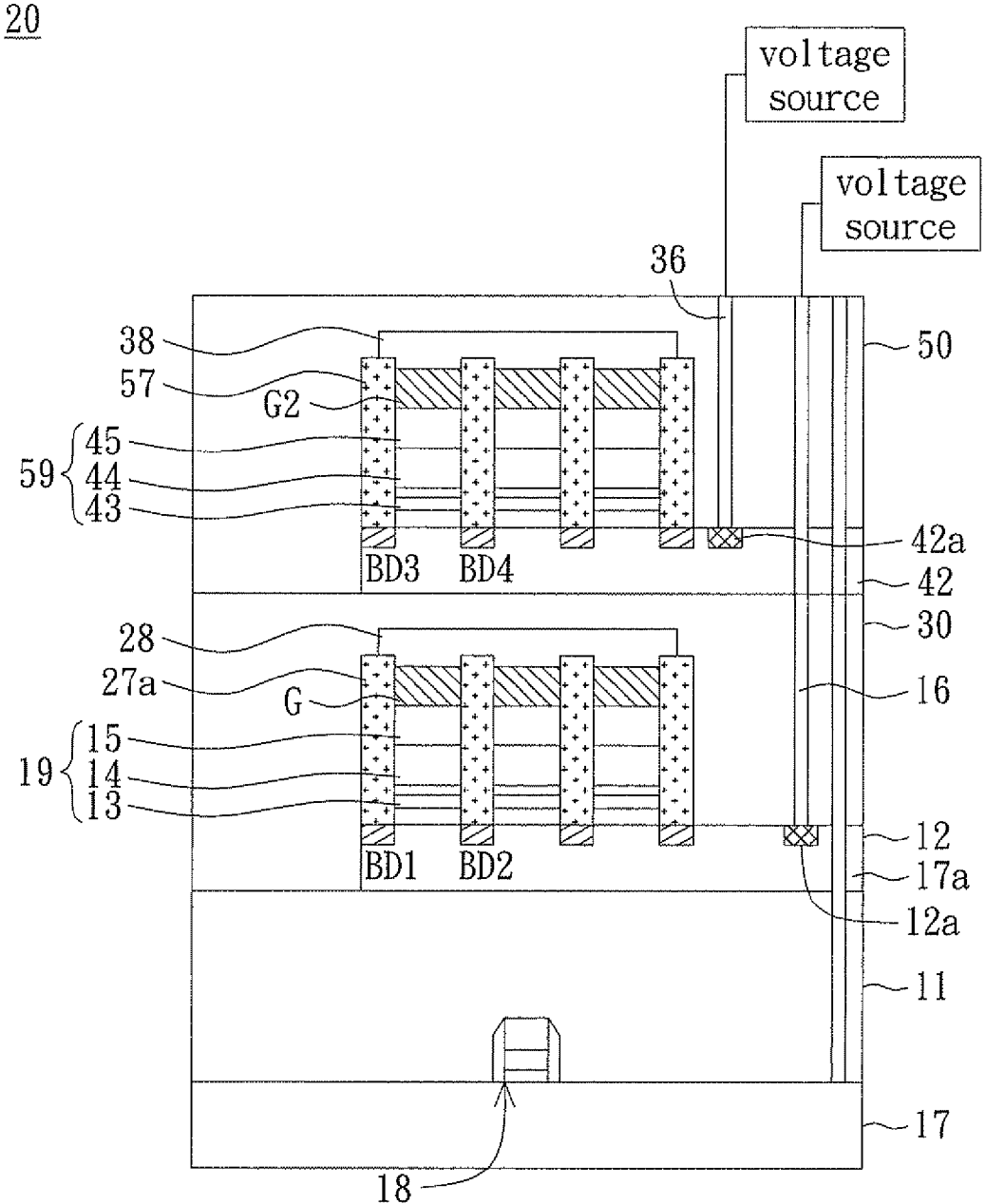
FIG. 3 is a cross-sectional view of a memory having stacking structure according to a preferred embodiment of the present invention.

But the embodiment of the invention is not limited herein. Referring to FIG. 3, a cross-sectional view of a memory having stacking structure according to a preferred embodiment of the present invention is shown. After the dielectric layer 30 covers the word line 28, the charge storage structure 19 and the polysilicon layer 12, a second polysilicon layer 42 can be formed on the dielectric layer 30. And a second charge storage structure 59 is formed on the second polysilicon layer 42 according to the abovementioned steps. A third buried diffusion BD3 and a fourth buried diffusion BD4 are separately disposed on the surface of the second polysilicon layer 42 and positioned at the two sides of the second charge storage structure 59. The third insulating material layer 57 is disposed on the buried diffusions. Then a second gate G2 is disposed on the second charge storage structure 59, a word line 38 is coupled to the second gate G2, and a dielectric layer 50 is covered thereon. A conductive plug 36 connects the well 42a of the second polysilicon layer 42 to apply an exterior voltage to the second polysilicon layer 42, and thus a memory 20 having stacking memory cells is formed. Likewise, the charge storage structure 59 also includes a tunneling dielectric layer 43, a charge storage layer 44 and a blocking layer 45 in the present embodiment. Repeat the abovementioned steps, a three dimensional memory having multi-layered stacking structure is formed. Meanwhile, each memory cell can store dual bit such that the storage density of the memory increases greatly.

Moreover, in the forming steps of the memory in abovementioned embodiment, the tunneling dielectric layer 13 also can be an oxide layer so as to form a memory having SONOS structure. Or, the tunneling dielectric layer 13 can be an OSO layer so as to form a memory having SONOSOS structure. And if the gate is made of tantalum nitride, the blocking layer is made of aluminum oxide and the charge storage layer is made of nitride, the memory having TANOS structure is formed.

Otherwise, the forming sequence is that blocking material layer is formed first and then the storage material layer is formed in the abovementioned forming steps of memory, then the charge storage structure that electron or hole are injected from gate is formed. Meanwhile, if the storage material layer is made of nitride and the gate is made of polysilicon, the memory having SNOS structure is formed. If a tunneling dielectric layer is formed on the storage material layer, then the charge storage structure includes a tunneling dielectric layer intervening the gate and the charge storage layer. If the tunneling dielectric layer is an oxide layer, a memory having SONOS structure that electrons or holes are injected from the gate is formed. If the tunneling dielectric layer is an ONO layer, a memory having Top BE-SONOS structure is formed. If the dielectric layer is an OSO layer, a memory having SOSONOS structure is formed.

In the memory and the manufacturing method thereof according to the preferred embodiment of the present invention, the polysilicon layer formed on the dielectric layer is electrically connected to at least a voltage. As a result, the memory cell is formed on the polysilicon layer. The memory cell on the polysilicon layer is programmed through channel hot electron (CHE) injection or channel hot electron induced secondary electron (CHISEL) injection in the memory of the present embodiment. The memory cell is erased through hole tunneling erase, negative Fowler-Nordheim tunneling (−FN tunneling), or band to band hot hole (BBHH) injection. Therefore, several layers of memory cells are able to be piled according to the design of several dielectric layers and several polysilicon layers electrically connected to at least a voltage in the memory of the present embodiment. Therefore, the memory of the present invention increases memory density and capacity. The practicability of the memory is improved significantly.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory comprising:
 a first dielectric layer;
 a first polysilicon layer disposed on the first dielectric layer;
 a first buried diffusion and a second buried diffusion separately disposed in the first polysilicon layer;
 a first charge storage structure disposed on the first polysilicon layer and positioned between the first buried diffusion and the second buried diffusion;
 a first gate disposed on the first charge storage structure;
 a control device, wherein in one cross-section of the control device and the first poly silicon layer, the control device is disposed directly under the first polysilicon layer;
 a second dielectric layer covering the first gate, the first charge storage structure and the first polysilicon layer;
 a plug disposed on the first polysilicon layer and electrically connected to the first polysilicon layer;
 a voltage source; and
 wherein the plug penetrates the second dielectric layer, is exposed at a surface of the second dielectric layer and is connected to the voltage source.

2. The memory according to claim 1, further comprising a well disposed in the first polysilicon layer, so that the first polysilicon layer is electrically connected to the plug.

3. The memory according to claim 1, wherein the first charge storage structure comprises:
 a blocking layer disposed between the first gate and the first polysilicon layer; and
 a charge storage layer disposed next to the blocking layer.

4. The memory according to claim 3, wherein the first charge storage structure further comprises a tunneling dielectric layer disposed next to the charge storage layer.

5. The memory according to claim 4, wherein the tunneling dielectric layer includes a third tunneling-dielectric layer, a second tunneling-dielectric layer and a first tunneling-dielectric layer, wherein the second tunneling-dielectric layer is disposed between the first tunneling-dielectric layer and the third tunneling-dielectric layer.

6. The memory according to claim 5, wherein thickness of the first tunneling-dielectric layer is less than 20 A.

7. The memory according to claim 5, wherein thickness of the first tunneling-dielectric layer ranges between 5 A-20 A.

8. The memory according to claim 5, wherein thickness of the first tunneling-dielectric layer is less than 15 A.

9. The memory according to claim 5, wherein thickness of the second tunneling-dielectric layer is less than 20 A.

10. The memory according to claim 5, wherein thickness of the second tunneling-dielectric layer ranges between 10 A-20 A.

11. The memory according to claim 5, wherein thickness of the third tunneling-dielectric layer is less than 20 A.

12. The memory according to claim 5, wherein thickness of the third tunneling-dielectric layer ranges between 15 A-20 A.

13. The memory according to claim 4, wherein the tunneling dielectric layer is an ONO layer, an OSO layer or an oxide layer.

14. The memory according to claim 3, wherein the charge storage layer is a silicon nitride layer or an aluminum oxide layer.

15. The memory according to claim 3, wherein the blocking layer is an aluminum oxide layer or a silicon oxide layer.

16. The memory according to claim 1, wherein the material of the first gate is tantalum nitride (TaN) or polysilicon.

17. The memory according to claim 1, wherein the first dielectric layer comprises an interlayer dielectric (ILD) layer or an intermetallic dielectric (IMD) layer.

18. The memory according to claim 1, further comprising a silicon substrate, wherein the control device is disposed between the silicon substrate and the first dielectric layer.

19. A memory, comprising:
a first dielectric layer;
a first polysilicon layer disposed on the first dielectric layer;
a first buried diffusion and a second buried diffusion separately disposed in the first polysilicon layer;
a first charge storage structure disposed on the first polysilicon layer and positioned between the first buried diffusion and the second buried diffusion;
a first gate disposed on the first charge storage structure;
a second dielectric layer covering the first gate, the first charge storage structure and the first polysilicon layer;
a plug disposed on the first polysilicon layer and electrically connected to a doping well disposed in the first polysilicon layer;
a voltage source; and
wherein the plug penetrates the second dielectric layer, is exposed at a surface of the second dielectric layer and is connected to the voltage source.

20. The memory according to claim 2, wherein the well is separated from the first buried diffusion and the second buried diffusion.

21. A memory comprising:
a first dielectric layer;
a first polysilicon layer disposed on the first dielectric layer;
a first buried diffusion and a second buried diffusion separately disposed in the first polysilicon layer;
a first charge storage structure disposed on the first polysilicon layer and positioned between the first buried diffusion and the second buried diffusion;
a first gate disposed on the first charge storage structure;
a control device, wherein in one cross-section of the control device and the first poly silicon layer, the control device is disposed directly under the first polysilicon layer;
a second dielectric layer covering the first gate, the first charge storage structure and the first polysilicon layer;
a second polysilicon layer disposed on the second dielectric layer;
a third buried and a fourth buried diffusion separately disposed in the second polysilicon layer;
a second charge storage structure disposed on the second polysilicon layer and positioned between the third buried diffusion and the fourth buried diffusion; and
a second gate disposed on the second charge structure;
a first plug disposed on the first polysilicon layer and electrically connected to the first polysilicon layer;
a first voltage source;
wherein the first plug penetrates the second dielectric layer, is exposed at a surface of the second dielectric layer and is connected to the first voltage source;
a second plug disposed on the second polysilicon layer and electrically connected to the second polysilicon layer;
a second voltage source; and
wherein the second plug is connected to the second voltage source.

* * * * *